United States Patent [19]
Watanabe

[11] Patent Number: 5,977,807
[45] Date of Patent: Nov. 2, 1999

[54] OUTPUT BUFFER CIRCUIT FOR TRANSFERRING A HIGH SPEED SIGNAL BETWEEN LARGE SCALE INTEGRATED CIRCUITS

[75] Inventor: Hiroyuki Watanabe, Kanagawa, Japan

[73] Assignee: NEC Corporation, Tokyo, Japan

[21] Appl. No.: 09/162,761

[22] Filed: Sep. 30, 1998

[30] Foreign Application Priority Data

Sep. 30, 1997 [JP] Japan ..................................... 9-265581

[51] Int. Cl.⁶ ............................ H03K 3/017; H03K 5/04; H03K 7/08
[52] U.S. Cl. ............................ 327/175; 327/176; 327/35
[58] Field of Search .................................... 227/172, 175, 227/176, 165, 31, 35, 108, 112; 326/82, 85, 87

[56] References Cited

U.S. PATENT DOCUMENTS

| | | | |
|---|---|---|---|
| 5,121,013 | 6/1992 | Chuang et al. | 326/26 |
| 5,319,258 | 6/1994 | Ruetz | 326/87 |
| 5,568,044 | 10/1996 | Bittner | 323/272 |
| 5,675,273 | 10/1997 | Masleid | 327/156 |
| 5,841,305 | 11/1998 | Wilson | 327/175 |

FOREIGN PATENT DOCUMENTS

4-373310  12/1992  Japan .

Primary Examiner—Timothy P. Callahan
Assistant Examiner—An T. Luu
Attorney, Agent, or Firm—Young & Thompson

[57] ABSTRACT

An output buffer circuit for transferring a high speed signal between large scale integrated circuits includes a first inverter with first and second transistors of opposite conductivity type, a second inverter with third and fourth transistors of opposite conductivity type, and a switch circuit for controlling the gates of the first and second transistors in accordance with a test control signal so as to change a dividing power. The respective outputs of the first and second inverters are connected in common to an output signal having a predetermined signal level related to an input signal. The circuit includes a duty ratio adjusting circuit which controls the respective gates of the first and second transistors to substantially equalize the first delay time until the output signal changes from a first level to a second level in response to a transition of the input signal, and a second delay time until the output signal changes from the second level to the first level in response to a transition of the input signal. The output buffer circuit maintains the duty ratio at about 50%.

4 Claims, 10 Drawing Sheets

OUTPUT BUFFER CIRCUIT FOR TRANSFERRING A HIGH SPEED SIGNAL BETWEEN LARGE SCALE INTEGRATED CIRCUITS

BACKGROUND OF THE INVENTION

1. Field of the Invention

The present invention relates to a output buffer circuit, and more specifically to a output buffer circuit used in an interface for transferring a high speed signal between LSIs.

2. Description of Related Art

With a recent advancement of a multi-function and a low power consumption of systems, an interface between LSIs (large scaled integrated circuits) are required to be a high speed and a small amplitude. In order to realize a high speed interface, it is necessary to make the amplitude of an output waveform small. However, since the amplitude is determined by a ground potential or a power supply potential as a reference, an internal operation threshold becomes different from an output signal threshold, with the result that a time ratio between a high level period and a low level period of the output signal waveform cannot be maintained at 1:1 (50%), and becomes apt to greatly vary. In addition, since many functions are incorporated in one LSI, the number of pins of a LSI package becomes large, and therefore, a noise becomes a problem at a testing time because a plurality of buffers operate concurrently. In order to avoid this problem, a noise suppressing circuit is inserted, but this circuit becomes a cause attributable to change of the duty ratio of the output signal waveform.

The change of the duty ratio is a factor lowering the data transfer speed. Therefore, in order to realize a high speed interface so as to elevate performance of the system, it is necessary to maintain the duty ratio of the output signal waveform of an output buffer around 50%

Figure 5:
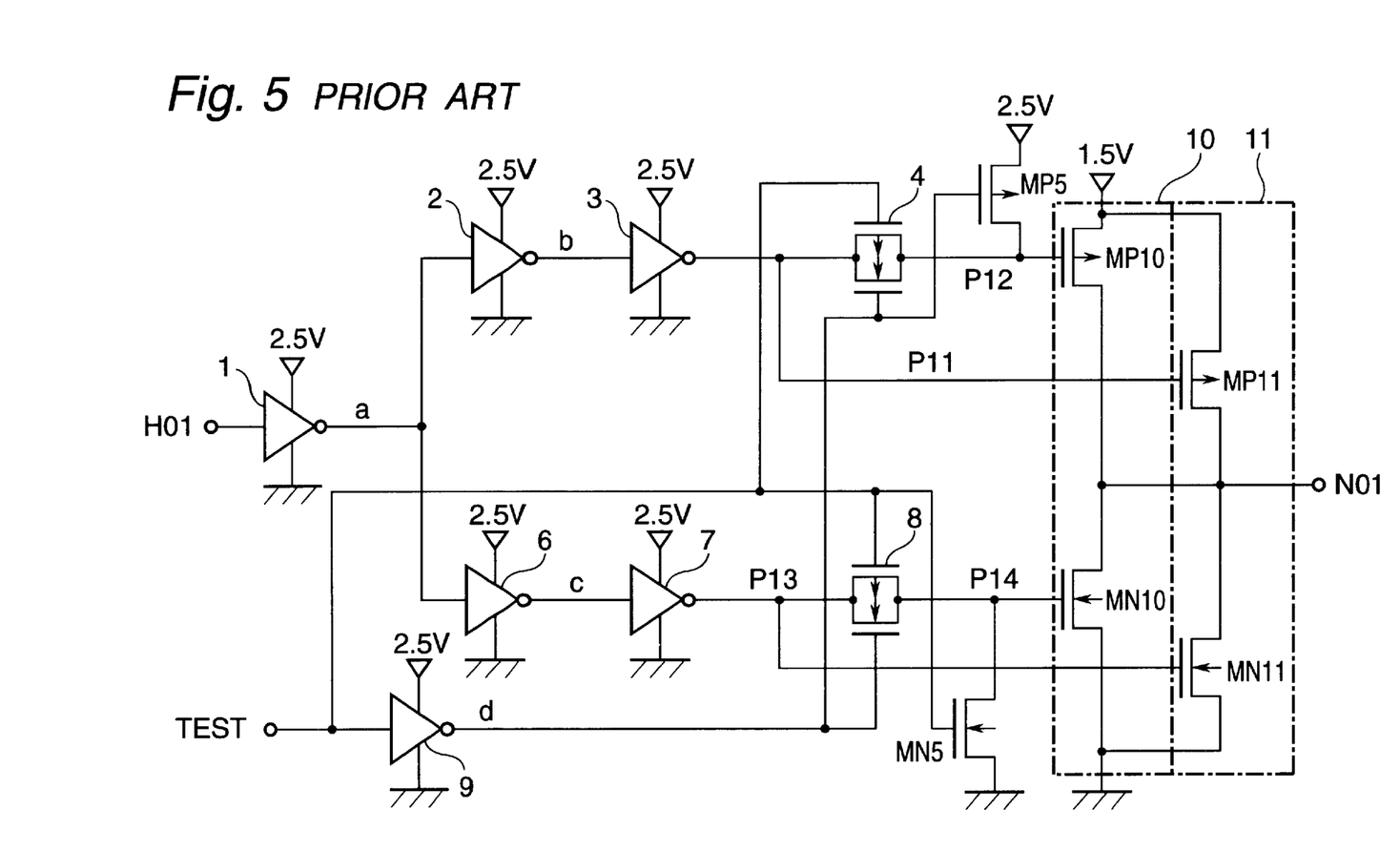
FIG. 5 is a circuit diagram of the first prior art output buffer circuit.

Referring to FIG. 5, there is shown, as an example of a first prior art output buffer circuit, a circuit of a buffer circuit of a HSTL (high speed transceiver logic) interface standardized by E1A/JEDEC, which is recently used as one of interfaces for transferring a high speed signal between semiconductor integrated circuits. This first prior art output buffer circuit includes an inverter 1 responding to an input signal H01 to generate an inverted signal "a", an inverter 9 responding to an input signal TEST to generate an inverted signal "d", an inverter 2 responding to the signal "a" to generate an inverted signal "b", an inverter 3 responding to the signal "b" to generate an inverted signal P11, a transfer gate 4 formed of a P-channel transistor having a gate receiving the input signal TEST and an N-channel transistor having a gate receiving the inverted signal "d" for controlling passage/block of the signal P11 in accordance with the level of the signal TEST so as to output a signal P12, and a P-channel transistor MP5 having a drain receiving the signal P12, and a gate receiving the signal "d" and a source connected to a 2.5 V power supply voltage.

The first prior art output buffer circuit further includes an inverter 6 receiving the signal "a" to generate an inverted signal "d", an inverter 7 responding to the signal "c" to generate an inverted signal P13, a transfer gate 8 formed of a P-channel transistor having a gate receiving the input signal TEST and an N-channel transistor having a gate receiving the inverted signal "d" for controlling passage/block of the signal P13 in accordance with the level of the signal TEST so as to output a signal P14, and an N-channel transistor MN5 having a drain receiving the signal P14, and a gate receiving the signal TEST and a source connected to ground. Furthermore, the first prior art output buffer circuit includes a P-channel transistor MP10 having a gate receiving the signal P12, a source connected to a 1.5 V power supply voltage, and a drain for outputting an output signal N01, an N-channel transistor MN10 having a gate receiving the signal P14, a source connected to the ground and a drain connected to the drain of the P-channel transistor MP10, a P-channel transistor MP11 having a gate receiving the signal P11, a source connected to the 1.5 V power supply voltage, and a drain connected to the drain of the P-channel transistor MP10, and an N-channel transistor MN11 having a gate receiving the signal P13, a source connected to the ground and a drain connected to the drain of the P-channel transistor MP10. The inverters 1 to 3, 6, 7 and 9 are driven with the 2.5 V power supply voltage.

In addition, the transistors MP10 and MN10 constitute an inverter 10, and the transistors MP11 and MN11 constitute an inverter 11.

Now, an operation of the first prior art output buffer circuit will be described with reference to FIG. 5. First, when the input signal TEST is at a low level, the transfer gates 4 and 8 are on, and the transistors MP5 and MN5 are off. Therefore, the input signal H01 is supplied to the inverter 10 formed of the transistors MP10 and MN10, an to the inverter 11 formed of the transistors MP11 and MN11, so that these inverters 10 and 11 output the output signal N01 in accordance with the input signal H01.

On the other hand, when the input signal TEST is at a high level, the transfer gates 4 and 8 are off, and the transistors MP5 and MN5 are on, so that the transistors MP10 and MN10 of the inverter 10 are rendered off. Accordingly, the output signal N01 in accordance with the input signal H01 is outputted by only the inverter 11, namely, only the transistors MP11 and MN11. Therefore, the driving power is lowered, so that a switching noise is suppressed.

Figure 6A:
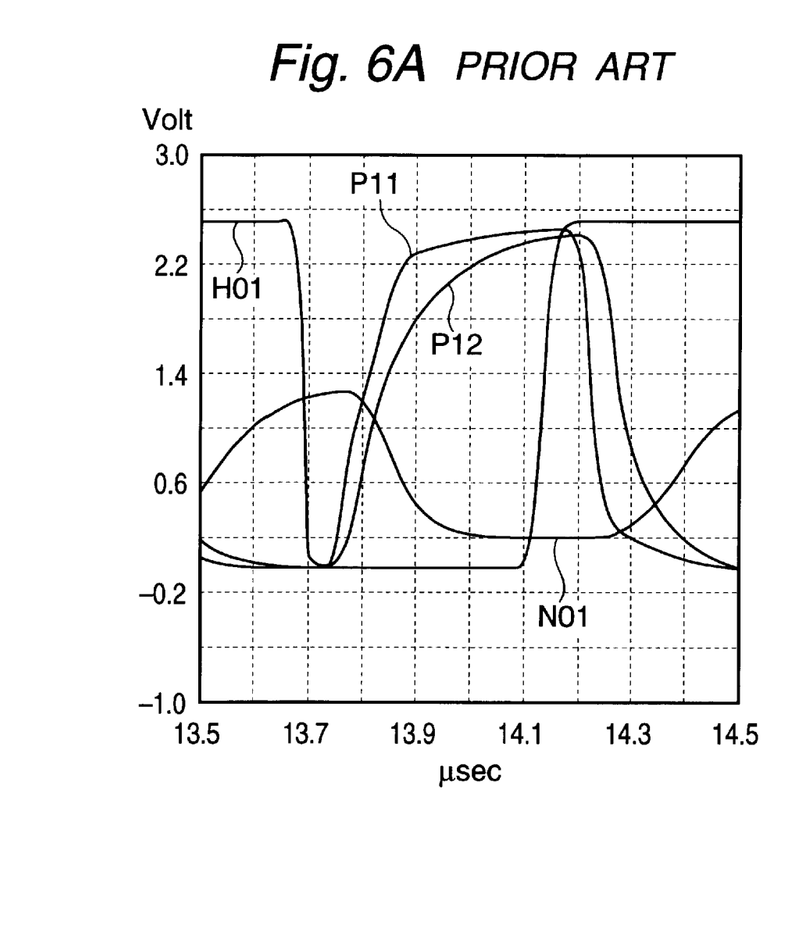
FIGS. 6A and 6B are timing charts illustrating an operation of the first prior art output buffer circuit.
Figure 6B:
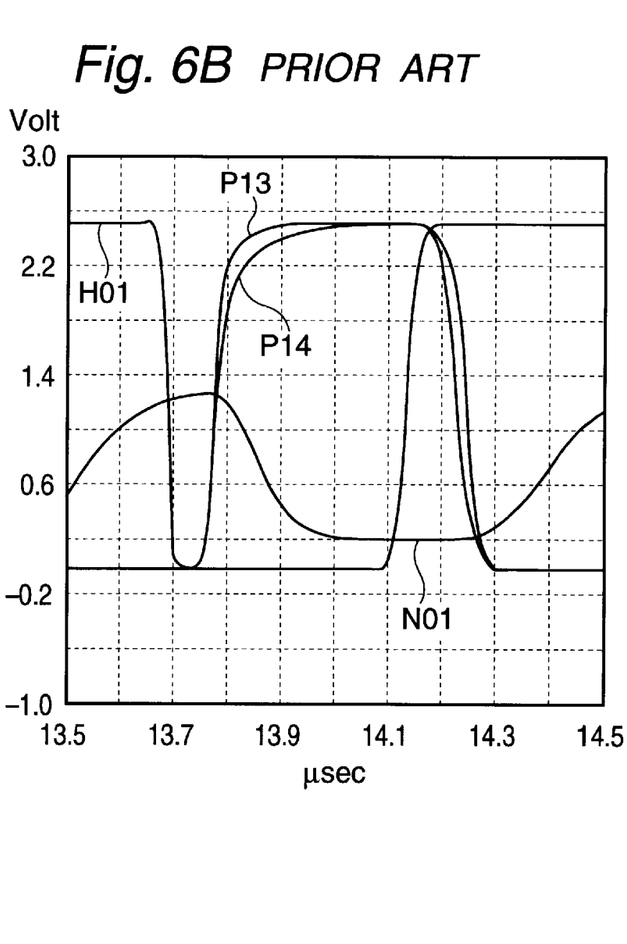

Next, an operation waveform of the first prior art output buffer circuit will be described in detail with reference to FIGS. 6A and 6B, which are timing charts showing various operation waveforms of the first prior art output buffer circuit.

When the input signal H01 is brought to the high level, after the signal P11 inputted to the gate of the transistor MP11 is brought to the low level, the signal P12 inputted to the gate of the transistor MP10 is brought to the low level. Simultaneously, after the signal P13 inputted to the gate of the transistor MN11 is brought to the low level, the signal P14 inputted to the gate of the transistor MN10 is brought to the low level. This is because the potential of the signal P11 is transferred through the transfer gate 4 as the signal P12 and the potential of the signal P13 is transferred through the transfer gate 8 as the signal P14.

Figure 7:
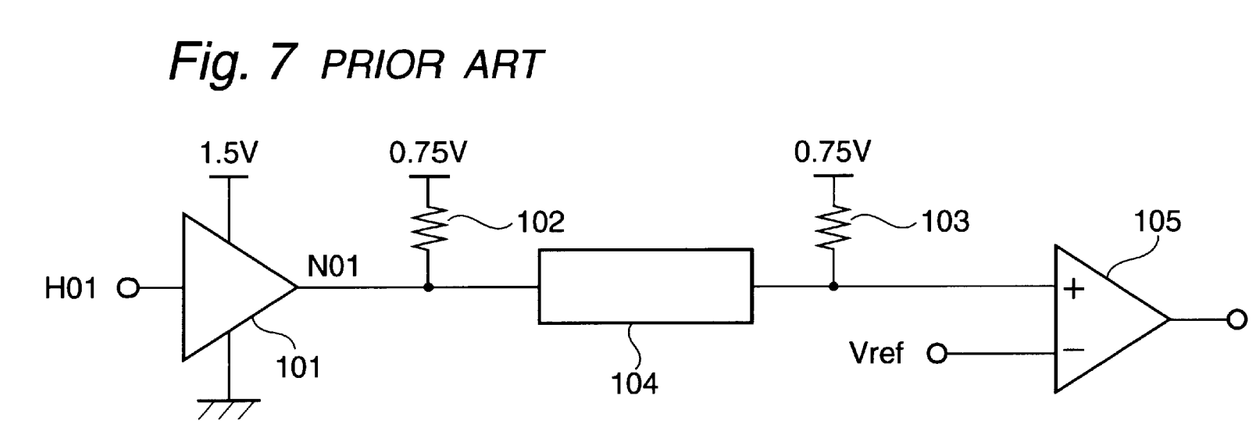
FIG. 7 is a block diagram for illustrating the construction of the HSTL class-2 interface.

In the HSTL interface, a terminating method of a transmission path is divided into four classes (class 1 to class 4). Referring to FIG. 7 which is a block diagram for illustrating the construction of the HSTL class-2 interface, this HSTL class-2 interface includes an output buffer 101 driven with a 1.5 V power supply voltage to output an output signal N01 in accordance with an input signal H01, a resistor 102 of a resistance of 50Ω having one end connected to a 0.75 V power supply voltage and the other end connected to the output of the output buffer 101, a transmission path 104 having an impedance of 50Ω and one end connected to the output of the output buffer 101, another resistor 103 of a resistance of 50Ω having one end connected to a 0.75 V power supply voltage and the other end connected to the output of the transmission path 104, and a differential amplifier 105 having a non-inverted input connected to the output of the transmission path 104, an inverted input connected to a reference signal Vref of 0.75 V. Here, the output buffer 101 is constituted of the first prior art output buffer circuit mentioned above or a second prior art output buffer circuit which will be described hereinafter.

Figure 8:
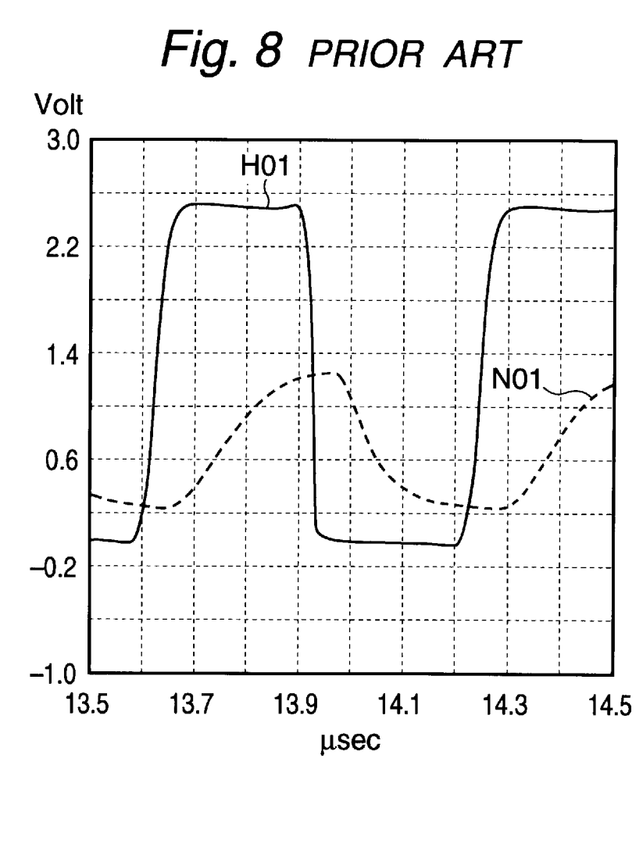
FIG. 8 is a timing chart illustrating input and output signal waveforms in the HSTL class-2 interface using the first prior art output buffer circuit.

Referring to FIG. 8, which is a timing chart illustrating input and output signal waveforms in the HSTL class-2 interface using the first prior art output buffer circuit as the output buffer 101, since the output of the output buffer 101 is connected to the resistors 102 and 103 clamped to 0.75 V, the output signal N01 of the output buffer 101 can obtain the amplitude of 0 V to 1.5 V.

Figure 9:
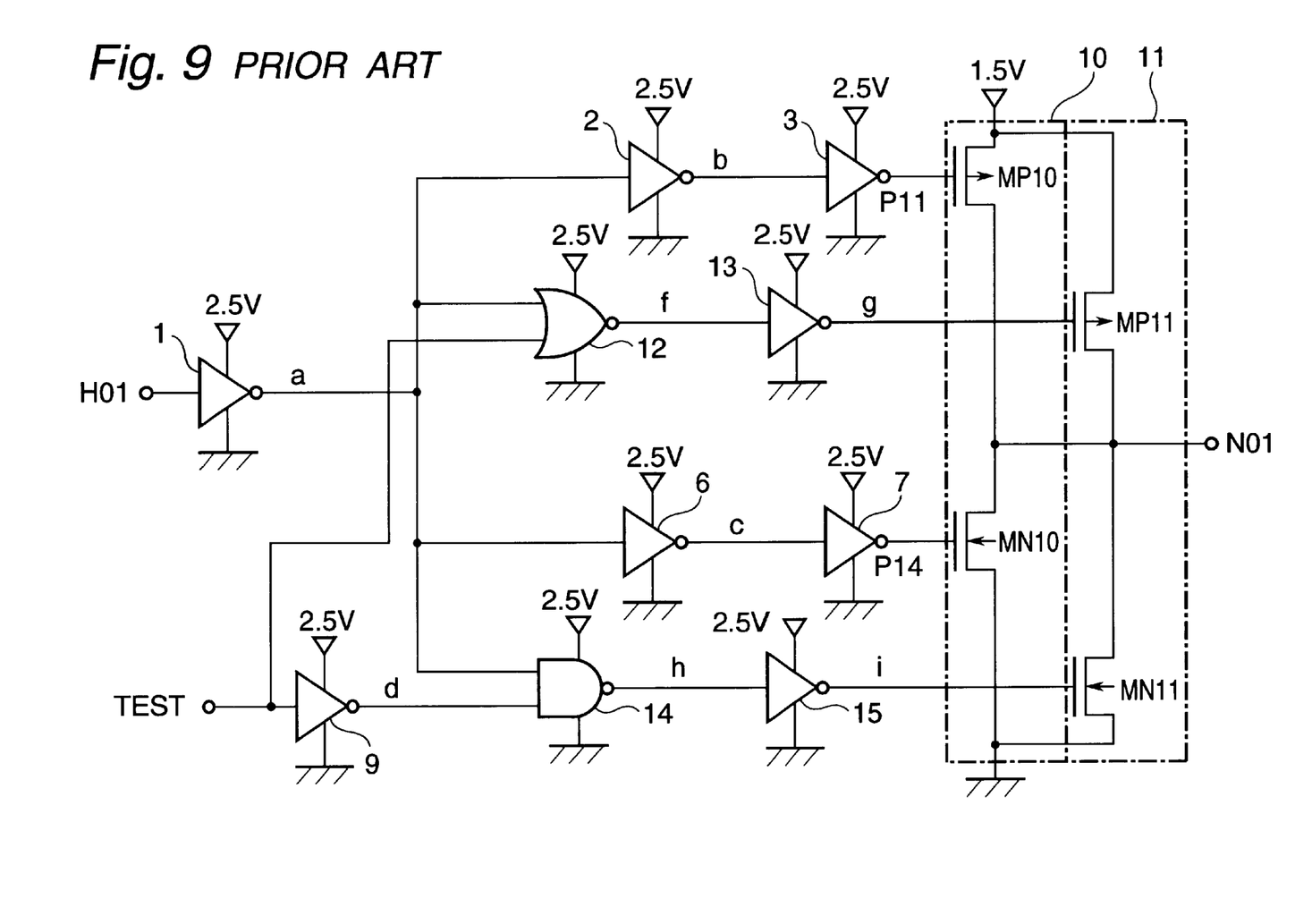
FIG. 9 is a circuit diagram of the second prior art output buffer circuit.

Referring to FIG. 9, there is shown a circuit diagram of the second prior art output buffer circuit used in the HSTL interface. In FIG. 9, elements similar to those shown in FIG. 5 are given the same Reference Numerals and Signs, and explanation will be omitted. This second prior art output buffer circuit includes, in addition to the inverters 1, 2, 3, 6, 7, 9, 10 and 11 in common to the first prior art output buffer circuit, a two-input NOR gate 12 receiving the input signal TEST and the output signal "a" of the inverter 1 for outputting a NOR output signal "f", an inverter 13 responding to the signal "f" to output an inverted signal "g" to the gate of the transistor MP11 of the inverter 11, a two-input NAND gate 14 receiving the output signal "d" of the inverter 9 and the signal "a" for outputting a NAND output signal "h", and an inverter 15 responding to the signal "h" to output an inverted signal "i" to the gate of the transistor MN11 of the inverter 11. In addition, the output signal P11 of the inverter 3 is supplied directly to the gate of the transistor MP10 of the inverter 10, and the output signal P14 of the inverter 7 is applied directly to the gate of the transistor MN10 of the inverter 10. The inverters 1 to 3, 6, 7, 9, 13 and 15, the NOR gate 12 and the NAND gate 14 are driven with the 2.5 V power supply voltage.

Now, an operation of the second prior art output buffer circuit will be described with reference to FIG. 9. First, when the input signal TEST is at the low level, the NOR gate 12 responds to the low level of this signal TEST received at its one input, to output the inverted signal "f" of the inverted signal "a" of the input signal H01 received at its other input. On the other hand, the NAND gate 14 responds to the high level of the signal TEST received at its one input, to output the inverted signal "h" of the input signal H01 received at its other input. Accordingly, the inverters 10 and 11 output the output signal N01 corresponding to the input signal H01.

When the input signal TEST is at the high level, the NOR gate 12 outputs the signal "f" of the low level in response to the high level of the signal TEST, and the NAND gate 14 outputs the signal "h" of the high level in response to the low level of the inverted signal "d" of the signal TEST. Accordingly, the transistors MP11 and MN11 of the inverter 11 are rendered off, so that the output signal N01 corresponding to the input signal H01 is outputted by only the inverter 10. Thus, the driving power is lowered, so that the switching noise is suppressed.

Figure 10:
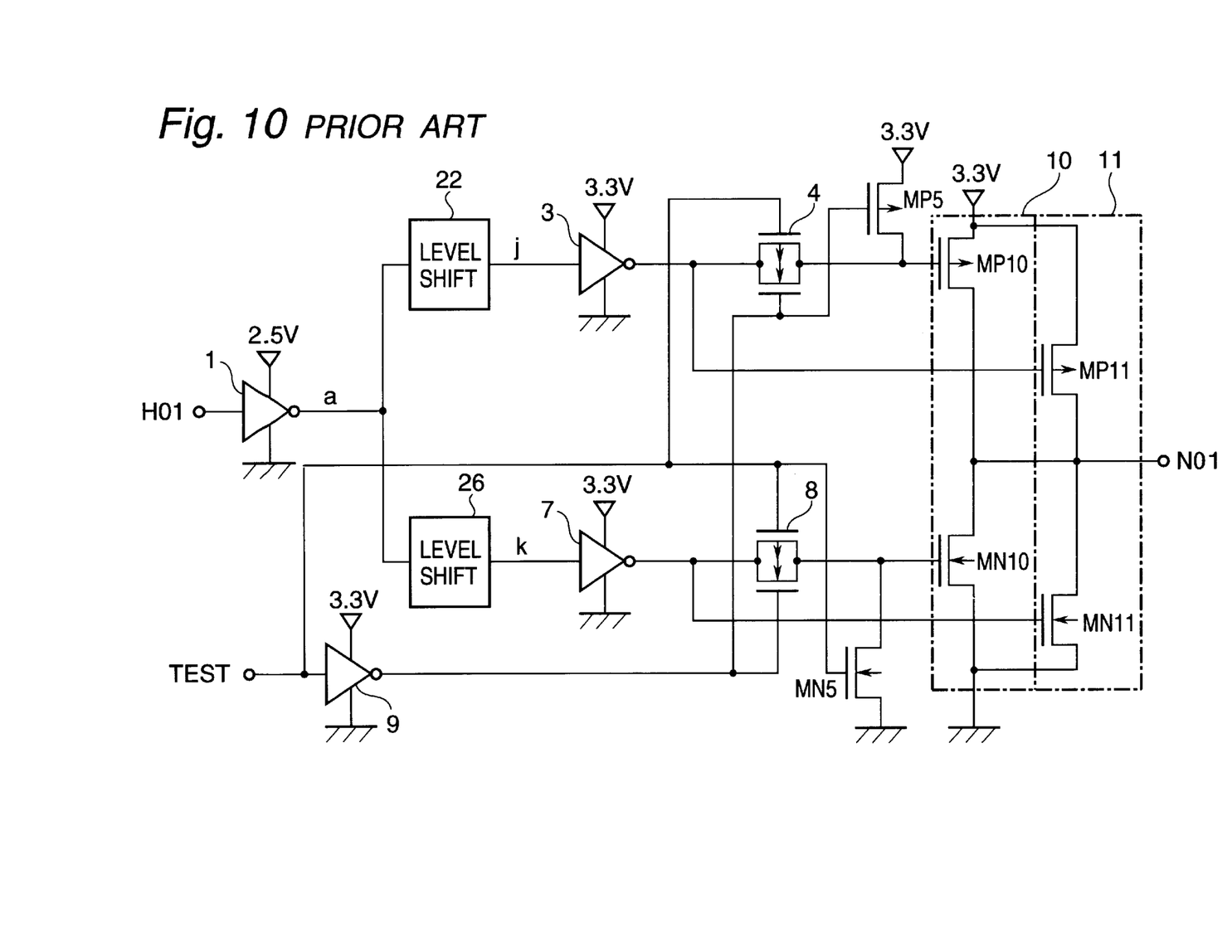
FIG. 10 is a circuit diagram of the third prior art output buffer circuit.

Referring to FIG. 10, there is shown a circuit diagram of a third prior art output buffer circuit, which is a buffer circuit of a SSTL (stub series terminated logic) interface standardized by E1A/JEDEC, and which is recently used as one of interfaces for transferring a high speed signal between semiconductor integrated circuits, similarly to the first and second prior art output buffer circuits. In FIG. 10, elements similar to those shown in FIG. 5 are given the same Reference Numerals and Signs, and explanation will be omitted.

This third prior art output buffer circuit includes, in addition to the inverters 1, 3, 7, 9, 10 and 11, the transfer gates 4 and 8, and the transistors MP5 and MN5 in common to the first prior art output buffer circuit, level shift circuits 22 and 26 receiving the output signal "a" of the inverter 1 for outputting predetermined level-shifted signals "j" and "k" to the inverters 3 and 7, respectively.

The inverter 1 is driven with the 2.5 V power supply voltage, and the other inverters 3, 7, 9, 10 and 11, the transfer gates 4 and 8, and the transistors MP5 and MN5 are driven with a 3.3 V power supply voltage.

Now, an operation of the third prior art output buffer circuit will be described with reference to FIG. 10. First, when the input signal TEST is at the low level, the transfer gates 4 and 8 are rendered on and the transistors MP5 and MN5 are rendered off, similarly to the first prior art output buffer circuit. Accordingly, the input signal H01 is supplied to the inverter 10 formed of the transistors MP10 and MN10 and the inverter 11 formed of the transistors MP11 and MN11, so that these inverters 10 and 11 output the output signal N01 in accordance with the input signal H01.

On the other hand, when the input signal TEST is at a high level, the transfer gates 4 and 8 are off, and the transistors MP5 and MN5 are on, so that the transistors MP10 and MN10 of the inverter 10 are rendered off. Accordingly, the output signal N01 in accordance with the input signal H01 is outputted by only the inverter 11, namely, only the transistors MP11 and MN11. Therefore, the driving power is lowered, so that a switching noise is suppressed.

This third prior art output buffer circuit is so configured to have an internal macro power supply voltage of 2.5 V, which is lower than 3.3 V of the output voltage, in order to reduce the power consumption of the LSI. Because of this, the output buffer requires the level shifting circuits 22 and 26 in order to elevate from 2.5 V to 3.3 V.

Figure 11:
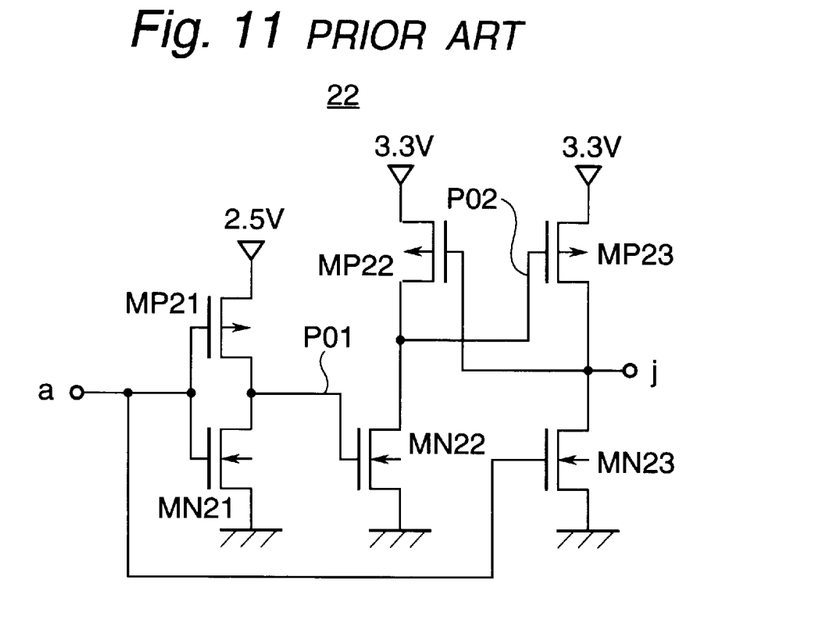
FIG. 11 is a circuit diagram showing the construction of the level shift circuit.

Referring to FIG. 11, which is a circuit diagram showing the construction of the level shift circuit 22, this level shift circuit 22 includes a P-channel transistor MP21 having a gate receiving the input signal "a", a source connected to the 2.5 V power supply voltage and a drain for outputting a signal P01, an N-channel transistor MN21 having a gate receiving the input signal "a", a source connected to ground and a drain connected to the drain of the transistor MP21, an N-channel transistor MN22 having a gate connected to the drain of the transistor MP21, a source connected to the ground and a drain for outputting a signal P02, a P-channel transistor MP22 having a gate receiving the output signal "j", a source connected to the 3.3 V power supply voltage and a drain connected to the drain of the transistor MN22, a P-channel transistor MP23 having a gate connected to the drain of the transistor MP22, a source connected to the 3.3 V power supply voltage and a drain for outputting the output signal "j", and an N-channel transistor MN23 having a gate receiving the input signal "a", a source connected to the ground and a drain connected to the drain of the transistor MP23.

Figure 12:
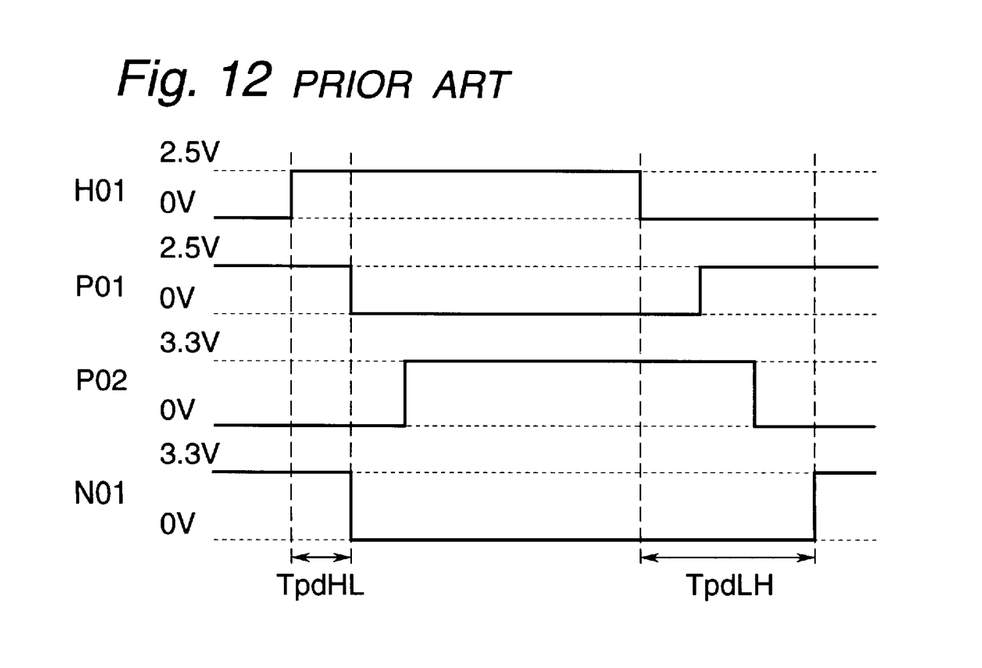
FIG. 12 is a timing chart illustrating operating waveforms of various points.

Now, an operation of the level shift circuit 22 will be described with reference to FIG. 11 and FIG. 12 which illustrates operating waveforms of various points. When the input signal "a" is brought to a high level (2.5 V), the transistor MN23 is turned on. At this time, the transistor MP23 of the last stage is also turned on, but since the size of the transistor MN23 is larger than that of the transistor MP23, a path-through current flows through the transistors MP23 and MN23, so that the output signal "J" becomes lower than a threshold of a next stage block, namely, becomes a low level. Thereafter, when the signal P02 reaches the high level of 3.3 V, the path-through current stops.

Then, when the input signal "a" is brought to the low level, the signal P01 is brought to the high level (2.5 V), and the transistor MN22 is turned on so that the signal P02 is brought to the low level, and therefore, the transistor MP23 is turned on. At this time, since the transistor MN23 has been turned off, the output signal "j" becomes the high level (3.3 V). Accordingly, a time TpdLH from the moment the input signal "a" is brought to the low level to the moment the output signal "j" is brought to the high level is longer than a time TpdHL from the moment the input signal "a" is brought to the high level to the moment the output signal "j" is brought to the low level. Namely, a delay time is long.

Figure 13:
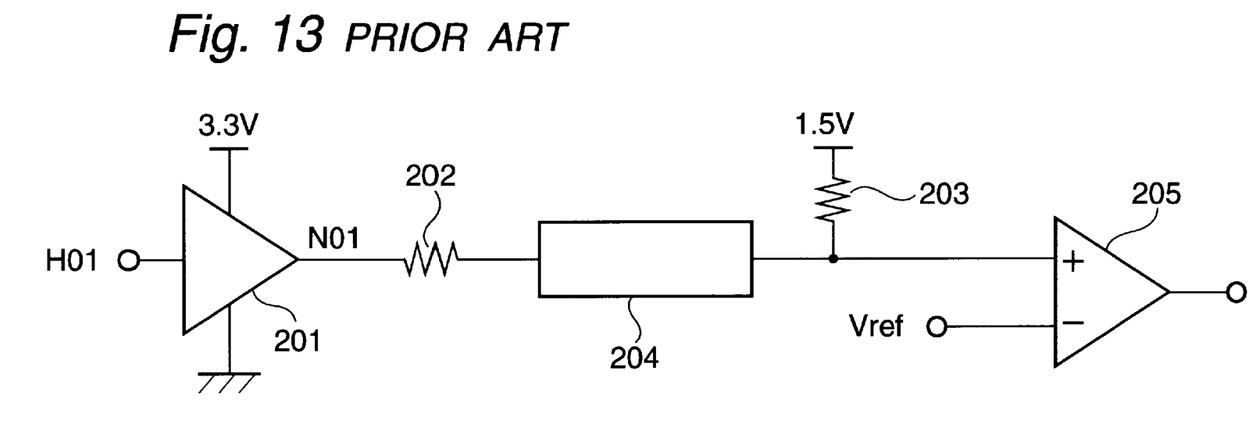
FIG. 13 which a block diagram for illustrating the construction of the SSTL class-2 interface.

In accordance with the method for terminating the transmission path, the SSTL interface is divided into two classes (class 1 and class 2). Referring to FIG. 13, which a block diagram for illustrating the construction of the SSTL class-2 interface, this SSTL class-2 interface includes an output buffer 201 driven with a 3.3 V power supply voltage to output an output signal N01 in accordance with an input signal H01, a resistor 202 of a resistance of 50Ω having one end connected to the output of the output buffer 201, a transmission path 204 having an impedance of 50Ω and one end connected to the other end of the resistor 202, another resistor 203 of a resistance of 25Ω having one end connected to a 1.5 V power supply voltage and the other end connected to the output of the transmission path 204, and a differential amplifier 205 having a non-inverted input connected to the output of the transmission path 204, an inverted input connected to a reference signal Vref of 1.5 V. Here, the output buffer 201 is constituted of the third prior art output buffer circuit mentioned above.

Even in this case, similarly to the first prior art output buffer circuit, the output signal N01 of the output buffer 201 can obtain the amplitude of 0 V to 3.3 V because of the resistor 202 connected to the output N01 of the output buffer 201 and the resistor 203 connected to the resistor 202 and clamped to 1.5 V.

A first problem of the first, second and third prior art output buffer circuits as mentioned above is that in the output signal of the first, second and third prior art output buffer circuits which are high speed buffers, since the duty ratio (the ratio between the high level period and the low level period) changes from 50% (called a "duty distortion" hereinafter), if the operating frequency is elevated, the level change occurs in the level having a shorter period so that a waveform distortion occurs, and in an extreme cases the output waveform disappears. Thus, the speed-up cannot be realized.

The reason for this is as follows: In the high speed buffer of the HSTL interface such as the first and second prior art output buffer circuits, the power supply voltage of the final stage inverter is 1.5 V, but in for example a 0.25 μm process, the power supply voltage of a pre-buffer is 2.5 V which is higher than 1.5 V. Therefore, at the rising time of the output signal of the buffer, the threshold of the final stage inverter is lower than the output signal waveform of the pre-buffer, and therefore, a long time is required until the output signal level of the pre-buffer becomes lower than the threshold of the final stage inverter. Namely, the delay time of the buffer becomes large. On the other hand, at a falling time of the output signal of the buffer, the output signal level of the pre-buffer immediately becomes higher than the threshold of the final stage inverter, and therefore, the delay time is small. Thus, the duty ratio of the output signal waveform becomes out of 50%.

Therefore, in order to effectively equalize the delay time in the rising and the delay time in the falling of the buffer output signal, it may be considered to adjust the size ratio between the P-channel transistor and the N-channel transistor in the output stage of the pre-buffer so as to minimize the duty distortion. However, since the difference between the pre-buffer output signal level and the threshold of the final stage inverter is as large as about 0.5 V, it is not possible to completely prevent the duty distortion of the output signal waveform.

In addition, in the high speed buffer as in HSTL, since the high level and the low level of the input and the output are prescribed in a DC standard, it is impossible to adjust the duty ratio by adjusting the size ratio between the P-channel transistor and the N-channel transistor in the output stage of the output buffer, since this results in change of the DC level. Accordingly, the duty distortion cannot be prevented by this adjustment of the size ratio.

Furthermore, in the buffer such as the first prior art output buffer circuit having the driving power control circuit for reducing the switching noise at the testing time, since the transfer gate is inserted between the pre-buffer and the final stage inverter, the output signal waveform of the pre-buffer is blunted by the on-resistance of the transfer gate so that the duty ratio changes. Therefore, if the size of the transfer gate is enlarged to reduce the on-resistance of the transfer gate, the diffused capacitance becomes large, with the result that the signal waveform of the pre-buffer is further blunted.

In the high speed buffer of the SSTL interface such as the third prior art output buffer circuit, the power supply voltage of the final stage inverter is 3.3 V, but in for example a 0.25 μm process, the power supply voltage of the pre-buffer is 2.5 V which is lower than 3.3 V. Therefore, the level shift circuit for elevating from 2.5 V to 3.3 V. However, since the signal transfer path is different between the high level outputting time and the low level outputting time as mentioned above, the delay time is greatly different. In addition, since the high level and the low level of the input and the output in the SSTL buffer are prescribed in the DC standard similarly to the HSTL, the duty distortion cannot be improved by adjusting the size ratio between the P-channel transistor and the N-channel transistor in the final state inverter.

In the first, second and third prior art output buffer circuits as mentioned above, because the internal operation threshold is different from the threshold of the output signal, because there is inserted the circuit for reducing the noise in the concurrent operation of a plurality of buffers at the testing time in an LSI package having a number of pins, the duty ratio of the output signal waveform (the ratio between the high level period and the low level period) changes from 50% (called a "duty distortion" hereinafter). Therefore, if the operating frequency is elevated, the level change occurs in the level having a shorter period so that a waveform distortion occurs, and in an extreme case, the output waveform disappears. Thus, the speed-up cannot be realized.

SUMMARY OF THE INVENTION

Accordingly, it is an object of the present invention to provide an output buffer circuit which has overcome the above mentioned defect of the conventional ones and capable of maintaining the duty ratio of the output signal at an ideal 50%.

The above and other objects of the present invention are achieved in accordance with the present invention by an output buffer circuit including a first inverter formed of a first transistor of a first conductivity type and a second transistor of a second conductivity type, a second inverter formed of a third transistor of the first conductivity type and a fourth transistor of the second conductivity type, and a switch circuit for controlling respective gates of the first transistor and the second transistor in accordance with a test control signal, so as to change a driving power, respective outputs of the first and second inverters being connected in common to output an output signal having a predetermined signal level in accordance with an input signal, a duty ratio adjusting circuit being provided to control the respective gates of the first and second transistors to substantially equalize a first delay time until the output signal changes from a first level to a second level in response to transition of the input signal and a second delay time until the output signal changes from the second level to the first level in response to transition of the input signal, thereby to maintain substantially at 50% the duty ratio which is a ratio between the sustaining time of the first level and the sustaining time of the second level in a waveform of the output signal.

The above and other objects, features and advantages of the present invention will be apparent from the following description of preferred embodiments of the invention with reference to the accompanying drawings.

DESCRIPTION OF THE PREFERRED EMBODIMENTS

Figure 1:
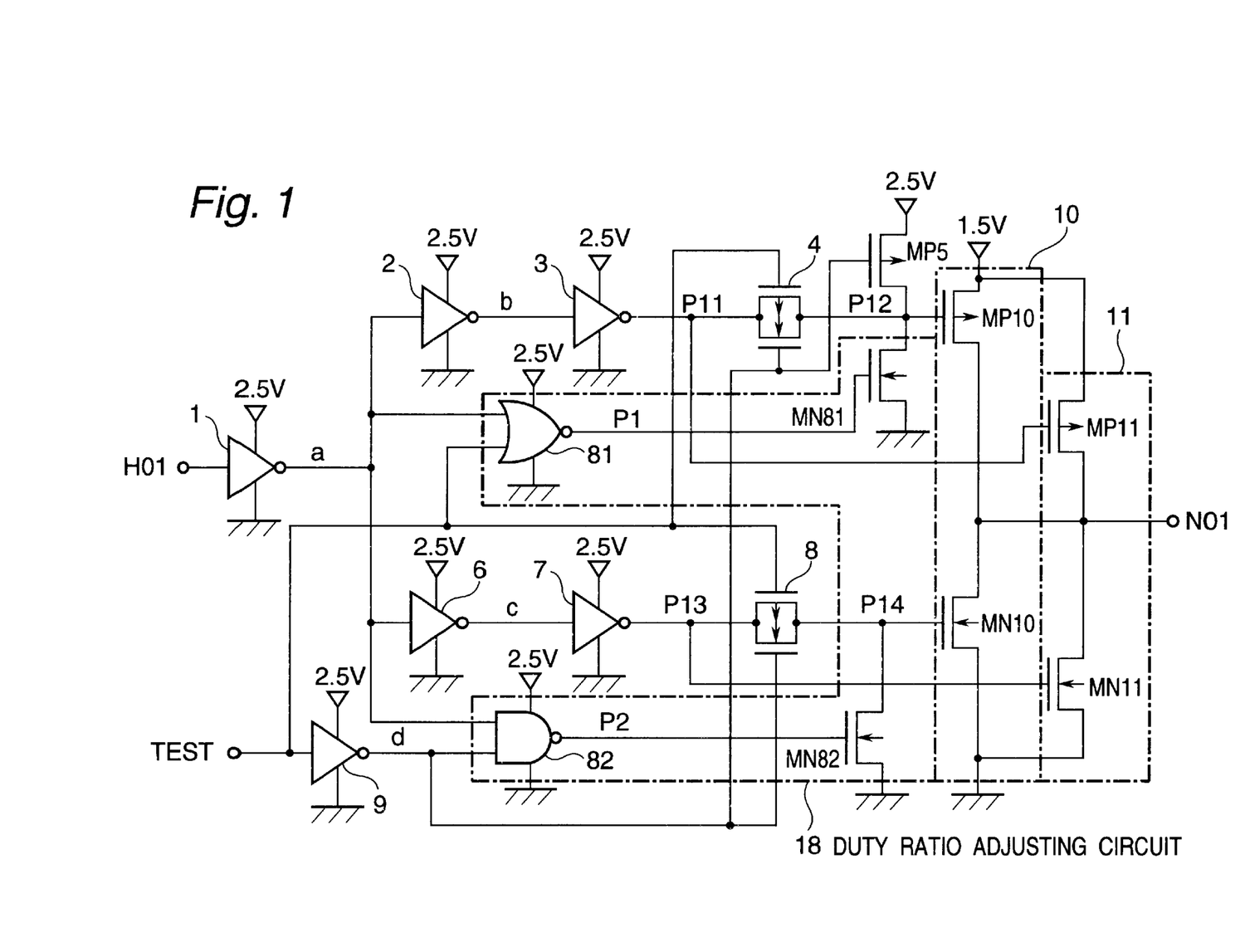
FIG. 1 is a circuit diagram of a first embodiment of the output buffer circuit in accordance with the present invention.

Referring to FIG. 1, there is shown a circuit diagram of a first embodiment of the output buffer circuit in accordance with the present invention. In FIG. 1, elements similar to those shown in FIG. 5 are given the same Reference Numerals and Signs, and explanation will be omitted. This embodiment of the output buffer circuit includes, in addition to the inverters 1, 2, 3, 6, 7, 9, 10 and 11, the transfer gates 4 and 8, and the transistor MP5 in common to the first prior art output buffer circuit, a duty ratio adjusting circuit 18 for controlling the gates of the transistors MP10 and MN10 of the inverter 10 so as to quicken the rising time thereby to approach the duty ratio of the output signal to 50%

This duty ratio adjusting circuit 18 includes a two-input NOR circuit 81 receiving the input signal TEST (test control signal) and the output signal "a" of the inverter 1 to generate a NOR output signal P1, an N-channel transistor MN81 having a gate receiving the signal P1, a drain connected to the gate of the transistor MP10 of the inverter 10 and a source connected to ground, a two-input NAND gate 82 receiving the output signal "d" of the inverter 9 and the signal "a" to generate a NAND output signal P2, and an N-channel transistor MN82 having a gate receiving the signal P2, a drain connected to the gate of the transistor MN10 of the inverter 10 and a source connected to ground.

Now, an operation of the shown embodiment will be described with reference to FIG. 1. First, when the input signal TEST is at a low level, the signal "d" is at a high level, so that the transfer gates 4 and 8 are on, and the transistors MP5 is turned off. In this condition, if the input signal H01 is brought to the high level, the inverted signal "a" is brought to the low level, and the output signal P1 of the NOR gate 81 in the duty ratio adjusting circuit 18 is brought to the high level. In response to this high level of the signal P1, the transistor MN81 is turned on, so that the drain potential of the transistor MN81, namely, the gate potential of the transistor MP10 of the inverter 10 lowers, with the result that the transistor MP10 is turned on. Furthermore, in response to the low level of the signal "a", the output signal P2 of the NAND gate 82 is brought to the high level. In response to the high level of the signal P2, the transistor MN82 is turned on, so that the drain potential of the transistor MN82, namely, the gate potential of the transistor MN10 of the inverter 10 lowers, with the result that the transistor MN10 is turned off.

Here, since it is so designed that the size of the transistors MP10 and MN10 of the inverter 10 is larger than the size of the transistors MP11 and MN11 of the inverter 11, the buffer output signal N01 becomes the high level, regardless of the operating condition of the inverter 11. In addition, after some delay, the output signal P11 of the inverter 3 is brought to the low level, so that the transistor MP11 of the inverter 11 is turned on, and simultaneously, the output signal P13 of the inverter 7 is brought to the low level, so that the transistor MN11 of the inverter 11 is turned off. Thus, the output signal N01 becomes the high level.

When the input signal H01 is brought to the low level, the output signal P1 of the NOR gate 81 in the duty ratio adjusting circuit 18 is brought to the low level, contrary to the above mentioned situation. In response to this low level of the signal P1, the transistor MN81 is turned off, so that the gate potential of the transistor MP10 of the inverter 10 elevates, with the result that the transistor MP10 is turned off. Furthermore, the output signal P2 of the NAND gate 82 is brought to the low level. In response to the low level of the signal P2, the transistor MN82 is turned off, so that the gate potential of the transistor MN10 of the inverter 10 elevates, with the result that the transistor MN10 is turned on. In addition, after some delay, the output signal P11 of the inverter 3 is brought to the high level, so that the transistor MP11 of the inverter 11 is turned off, and simultaneously, the output signal P13 of the inverter 7 is brought to the high level, so that the transistor MN11 of the inverter 11 is turned on. Thus, the output signal N01 becomes the low level.

On the other hand, when the input signal TEST is at a high level, the transfer gates 4 and 8 are off, and the transistors MP5 and the transistor MN82 of the duty ratio adjusting circuit 18 are turned on, so that the transistors MP10 and MN10 of the inverter 10 are rendered off. Accordingly, the output signal N01 in accordance with the input signal H01 is outputted by only the inverter 11, namely, only the transistors MP11 and MN11. Therefore, the driving power is lowered, so that a switching noise is suppressed.

Next, an operation of the duty ratio adjusting circuit 18 will be described with reference to FIG. 1. In a recent highly integrated LSI, the microfabrication of the circuit has been advanced to realize a high integration density, so that macro-circuits which constitute internal logic circuits are formed with a very small size. With this inclination, the size of the final stage inverter of the output buffer circuit is on the order of 350 times the size of the macro-circuits of general logic circuits driving the output buffer circuit. For example, in the case of the 0.25 µm rule, the size of the macro-circuits of general logic circuits is 3.32 µm, and the final stage inverter of the HSTL class-2 in this embodiment is 1190 µm. Therefore, in the case of designing the high speed buffer circuit, the pre-buffer for driving the final stage inverter is required to be constituted of a plurality of inverters connected in a cascaded manner, with the size of the cascaded inverters being gradually enlarged towards the final stage inverter. In this embodiment, the inverters 1, 2, 3 and the inverters 6 and 6 constitute the pre-buffers, respectively.

The duty ratio adjusting circuit 18 is so featured that, when the output signal N01 of the output buffer circuit rises up, the transistors MN81 and MN82 is turned on by the output signal "a" of the inverter 1 of the first stage of the pre-buffer, so as to forcibly pull down the gate potential of the transistors MP10 and MN10 of the final stage inverter 10.

For pulling down the gate potential of the transistors MP10 and MN10, the first prior art output buffer circuit uses the inverters 3 and 7, and the second prior art output buffer circuit uses the inverters 13 and 15. However, the shown embodiment uses the N-channel transistors MN81 and MN82 for pulling down the gate potential of the transistors MP10 and MN10. Since it is not necessary to directly drive the P-channel transistor MP10 having a large gate size, of the final stage inverter 10, the driving load can be reduced. Thus, the size of the transistors which constitute each of the NOR gate 81 and the NAND gate 82, can be made small, and therefore, the rising speed of the output signal N01 of the output buffer circuit can be elevated.

Figure 2A:
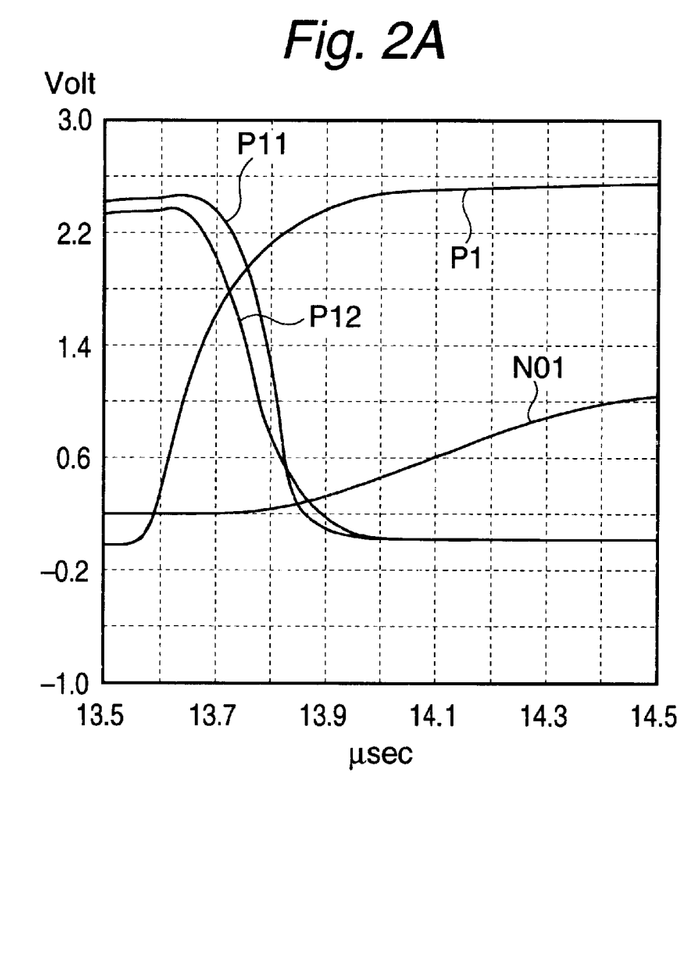
FIGS. 2A and 2B are timing charts illustrating an operation of the first embodiment of the output buffer circuit in accordance with the present invention.
Figure 2B:
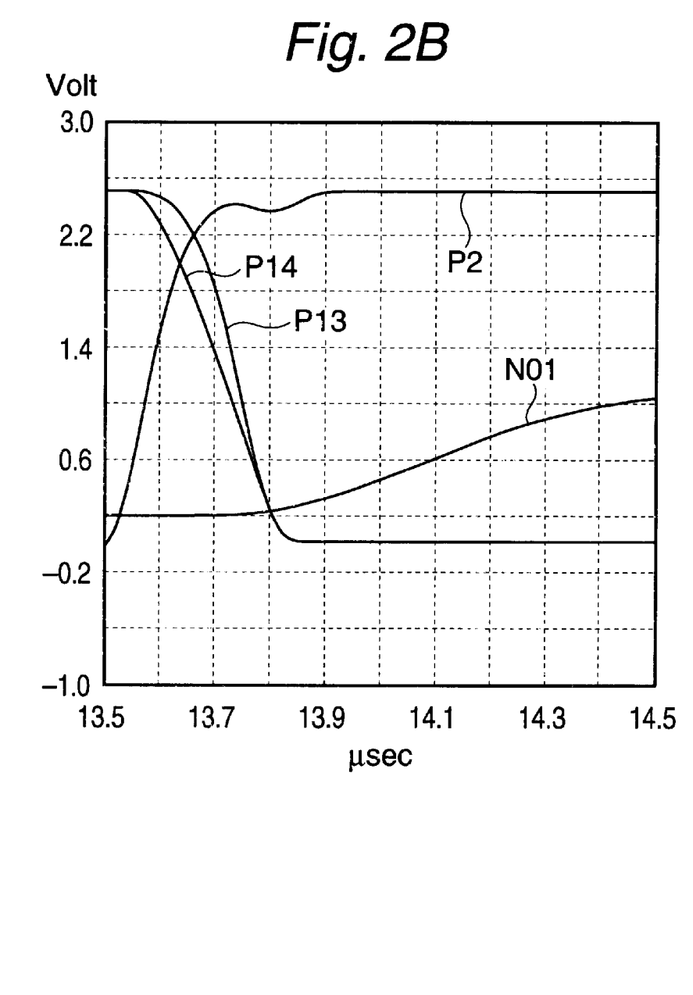

Now, an operation waveform of the duty ratio adjusting circuit 18 will be described in detail with reference to FIGS. 2A and 2B, which are timing charts showing operation waveforms at various points of the duty ratio adjusting circuit 18.

When the output signal N01 of the output buffer circuit rises up, the output signal P1 of the NOR gate 81 is brought to the high level to forcibly turn on the transistor MN81 so as to bring the gate voltage P12 of the transistor MP10 of the inverter 10. Thus, the signal P12 is caused to change earlier than the signal P11 supplied to the gate of the transistor MP11 of the inverter 1. Simultaneously, the output signal P2 of the NAND gate 82 is brought to the high level to turn on the transistor MN82 so as to forcibly bring the gate voltage P14 of the transistor MN10. Therefore, the signal P14 is caused to change to the low level earlier than the signal P13 supplied to the gate of the transistor MN11 of the inverter 11.

Figure 3:
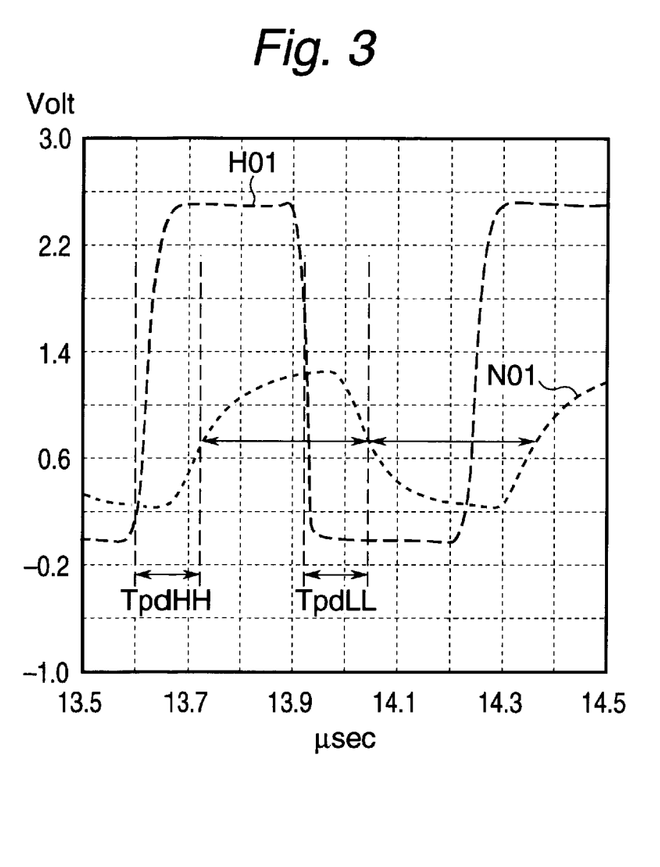
FIG. 3 is a timing chart illustrating input and output signal waveforms in the HSTL class-2 interface using the first embodiment of the output buffer circuit in accordance with the present invention.

Referring to FIG. 3 which is a timing chart illustrating input and output signal waveforms when the output buffer circuit of this embodiment is used as the output buffer 101 of the HSTL class-2 interface shown in FIG. 7, the time TpdHH from the moment the input signal H01 is brought to the high level to the moment the output signal N01 actually becomes the high level is improved to 761 ps by action of the duty ratio adjusting circuit 18, while it was 1189 ps and 909 ps in the first and second prior art output buffer circuits, respectively. On the other hand, the time TpdLL from the moment the input signal H01 is brought to the low level to the moment the output signal N01 actually becomes the low level is elongated to 699 ps to some degree, while it was 679 ps and 641 ps in the first and second prior art output buffer circuits, respectively.

As a result, when the output signal frequency is 267 Mhz, the duty ratio of the output signal waveform was 36.3% and 42.8% in the first and second prior art output buffer circuits, respectively, but is 48.3% in this embodiment. In other words, this embodiment greatly improves the duty ratio of the output signal waveform to a value near to 50%.

Figure 4:
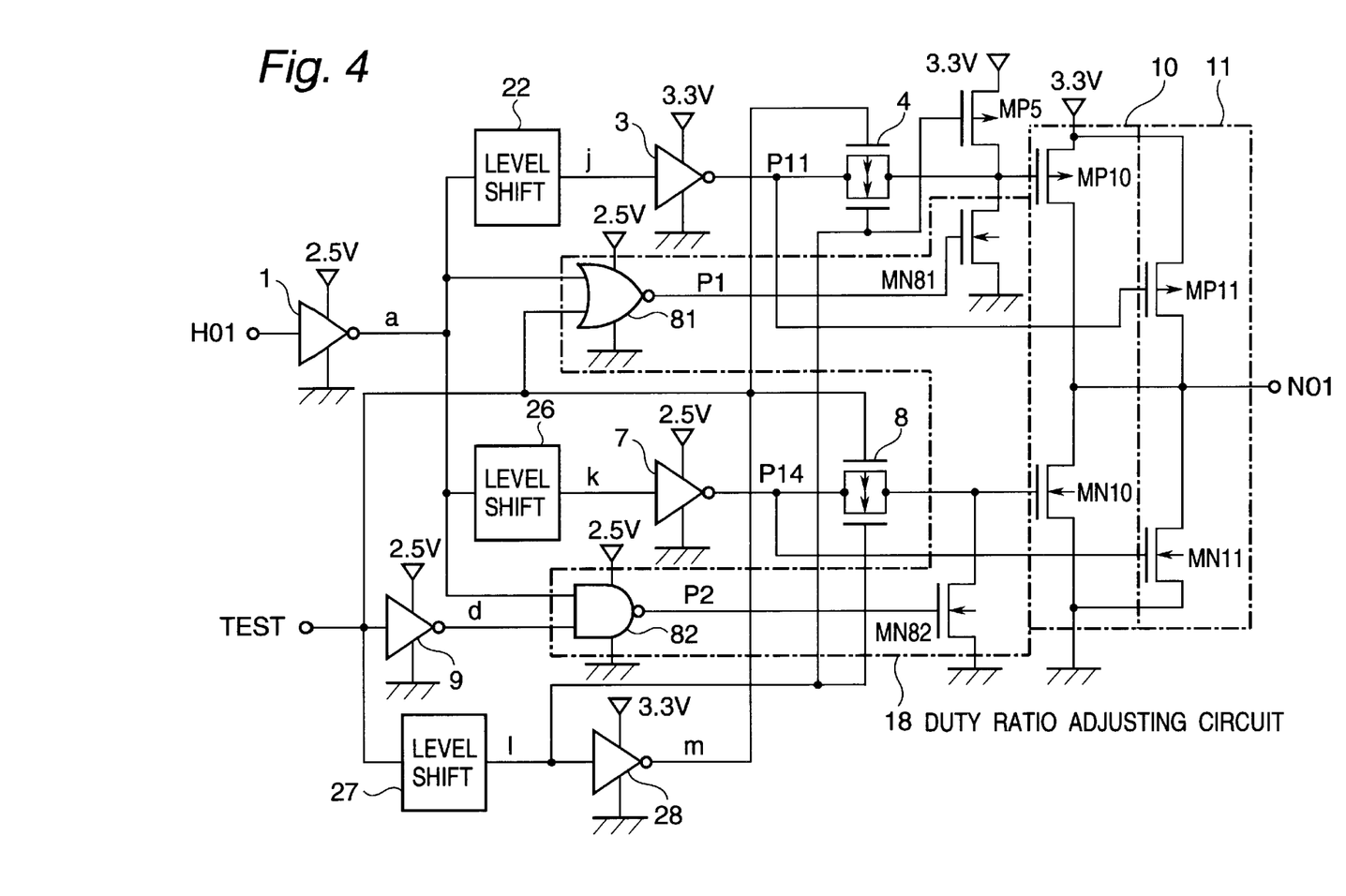
FIG. 4 is a circuit diagram of a second embodiment of the output buffer circuit in accordance with the present invention.

Referring to FIG. 4, there is shown a circuit diagram of a second embodiment of the output buffer circuit in accordance with the present invention. In FIG. 4, elements similar to those shown in FIG. 1 are given the same Reference Numerals and Signs, and explanation will be omitted.

In order to apply the output buffer circuit to the SSTL interface, the second embodiment is different from the first embodiment in that the inverters 2 and 3 are replaced with level shift circuits 22 and 23 for elevating the signal level to 3.3 V, respectively, in that there are added a level shift circuit 27 for elevating the signal level of the test signal TEST to output a level-shifted signal "1" and an inverter 28 for inverting the signal "1" to generate an inverted signal "m", and in that the inverter 1 is driven with the 2.5 V power supply voltage and the other inverters 3, 7 and 28, the transfer gates 4 and 8 and the transistor MP5 are driven with the 3.3 V power supply voltage.

Now, describing an operation of the second embodiment with reference to FIG. 4, the operation is the same as that of the first embodiment, excepting the level shift operation for elevating the input signal H01 of 2.5 V to the output signal N01 of 3.3 V. Accordingly, the operation of the duty ratio adjusting circuit is the same as that in the first embodiment.

As mentioned above, since the output buffer circuit of the present invention can shorten the delay time in the rising of the output signal by means of the duty ratio adjusting circuit, it is possible to maintain the duty ratio at a value near to an ideal 50%, and therefore, to speed up the signal transfer rate between LSIs.

As mentioned above, the output buffer circuit of the present invention includes the duty ratio adjusting circuit for controlling the respective gates of the first and second transistors to substantially equalize a first delay time until the output signal changes from a first level to a second level in response to transition of the input signal and a second delay time until the output signal changes from the second level to the first level in response to transition of the input signal. Since the duty ratio adjusting circuit responds to the output signal of the first stage inverter in the pre-buffer circuit composed of a plurality of cascaded inverters and directly controls the gates of the respective transistors in the final stage inverter, the delay time in the rising of the output signal can be shortened so as to maintain the duty ratio at a value near to the ideal 50%. Therefore, the signal transfer rate between LSIs can be elevated.

The invention has thus been shown and described with reference to the specific embodiments. However, it should be noted that the present invention is in no way limited to the details of the illustrated structures but changes and modifications may be made within the scope of the appended claims.

I claim:

1. An output buffer circuit including a first inverter formed of a first transistor of a first conductivity type and a second transistor of a second conductivity type, a second inverter formed of a third transistor of said first conductivity type and a fourth transistor of said second conductivity type, and a switch circuit for controlling respective gates of said first transistor and said second transistor in accordance with a test control signal, so as to change a driving power, respective outputs of said first and second inverters being connected in common to output an output signal having a predetermined signal level in accordance with an input signal, a duty ratio adjusting circuit being provided to control the respective gates of said first and second transistors to substantially equalize a first delay time until said output signal changes from a first level to a second level in response to transition of said input signal and a second delay time until said output signal changes from said second level to said first level in response to transition of said input signal, thereby to maintain substantially at 50% the duty ratio which is a ratio between the sustaining time of said first level and the sustaining time of said second level in a waveform of said output signal.

2. An output buffer circuit claimed in claim 1 wherein said switch circuit include a transfer gate for blocking said input signal in response to said test control signal.

3. An output buffer circuit claimed in claim 1 wherein said duty ratio adjusting circuit includes:

first and second logic circuits receiving said test control signal and said input signal for outputting a first logic signal and a second logic signal indicative of the result of respective logic operation, respectively;

a fifth transistor of said second conductivity type having a drain connected to the gate of said first transistor, a source connected to ground, and a gate receiving said first logic signal; and a sixth transistor of said second conductivity type having a drain connected to the gate of said second transistor, a source connected to ground, and a gate receiving said second logic signal.

4. An output buffer circuit claimed in claim 1 wherein the amplitude of said input signal and said test control signal is smaller than the amplitude of said output signal, and further including level shift means for elevating said input signal and said test control signal to the amplitude of said output signal.

* * * * *